(12) United States Patent
Busi et al.

(10) Patent No.: US 9,715,942 B2
(45) Date of Patent: Jul. 25, 2017

(54) BUILT-IN SELF-TEST (BIST) CIRCUIT AND ASSOCIATED BIST METHOD FOR EMBEDDED MEMORIES

(71) Applicant: International Business Machines Corporation, Armonk, NY (US)

(72) Inventors: Aravindan J. Busi, Bangalore (IN); Deepak I. Hanagandi, Bagalkot (IN); Krishnendu Mondal, Bangalore (IN); Michael R. Ouellette, Westford, VT (US)

(73) Assignee: International Business Machines Corporation, Armonk, NY (US)

( * ) Notice: Subject to any disclaimer, the term of this patent is extended or adjusted under 35 U.S.C. 154(b) by 223 days.

(21) Appl. No.: 14/734,041

(22) Filed: Jun. 9, 2015

(65) Prior Publication Data

US 2016/0365156 A1    Dec. 15, 2016

(51) Int. Cl.
| | |
|---|---|
| *G01R 31/28* | (2006.01) |
| *G11C 29/18* | (2006.01) |
| *G11C 29/36* | (2006.01) |
| *G11C 29/38* | (2006.01) |

(52) U.S. Cl.
CPC ............. *G11C 29/18* (2013.01); *G11C 29/36* (2013.01); *G11C 29/38* (2013.01)

(58) Field of Classification Search
CPC ......... G11C 29/18; G11C 29/36; G11C 29/38; G11C 29/02; G11C 29/14; G11C 29/20
See application file for complete search history.

(56) References Cited

U.S. PATENT DOCUMENTS

| | | | |
|---|---|---|---|
| 5,974,579 A | 10/1999 | Lepejian et al. | |
| 5,983,009 A | 11/1999 | Lepejian et al. | |
| 6,360,342 B1 * | 3/2002 | Lee ..................... | G11C 29/14 714/718 |
| 6,388,930 B1 | 5/2002 | Obremski | |
| 6,425,103 B1 | 7/2002 | Phan | |
| 6,769,081 B1 | 7/2004 | Parulkar | |
| 7,181,659 B2 | 2/2007 | Bravo et al. | |
| 7,757,141 B2 | 7/2010 | Chickanosky et al. | |
| 7,814,380 B2 | 10/2010 | Averbuj et al. | |

(Continued)

FOREIGN PATENT DOCUMENTS

WO    2012001053 A1    1/2012

*Primary Examiner* — David Ton
(74) *Attorney, Agent, or Firm* — Gibb & Riley, LLC

(57) ABSTRACT

Disclosed is a chip with a built-in self-test (BIST) circuit that incorporates a BIST engine that tests memories in parallel and that, prior to testing, dynamically sets the size of the address space to be swept. The BIST engine comprises an address generator that determines a superset of address space values associated with all the memories. This superset indicates the highest number of banks, the highest number of word lines per bank and the highest decode number for any of the memories. The address generator then generates test addresses and does so such that all test addresses are within a composite address space defined by the superset and, thereby within an address space that may, depending upon the memory configurations, be less than the predetermined maximum address space associated with such memories so as to reduce test time. Also disclosed is an associated BIST method for testing memories.

20 Claims, 7 Drawing Sheets

(56) References Cited

U.S. PATENT DOCUMENTS

| | | | |
|---|---|---|---|
| 7,870,454 B2 | 1/2011 | Gorman et al. | |
| 7,945,823 B2 | 5/2011 | Doddamane et al. | |
| 8,914,688 B2 | 12/2014 | Belansek et al. | |
| 2005/0015671 A1* | 1/2005 | Parulkar | G11C 29/16 714/30 |
| 2008/0098269 A1 | 4/2008 | Bhavsar et al. | |
| 2011/0029827 A1 | 2/2011 | Chickanosky et al. | |
| 2014/0129888 A1 | 5/2014 | Chickanosky et al. | |
| 2014/0149810 A1* | 5/2014 | Belansek | G11C 29/20 714/720 |
| 2014/0189448 A1 | 7/2014 | Hanagandi et al. | |
| 2014/0258797 A1 | 9/2014 | Gorman et al. | |

* cited by examiner

BUILT-IN SELF-TEST (BIST) CIRCUIT AND ASSOCIATED BIST METHOD FOR EMBEDDED MEMORIES

BACKGROUND

The present disclosure relates to built-in self-test (BIST) of embedded memories on an integrated circuit chip and, specifically, to BIST circuits and methods that provide for dynamically setting the size of the address space to be swept prior to testing in order to reduce test time.

With advances in technologies and device scaling, integrated circuit chip designs incorporate an increasingly large number of embedded memories (also referred to herein as embedded memory arrays) as well as built-in self-test (BIST) circuits for testing such embedded memories, when operating in a test mode (as opposed to a functional mode). Oftentimes an integrated circuit chip design will incorporate multiple BIST engines controlled by a BIST controller and each BIST engine will test multiple embedded memories of the same specific type (e.g., multiple static random access memory arrays (SRAMs), multiple dynamic random access memory arrays (DRAMs), etc.) in parallel.

In this case, the BIST engine will comprise an address generator and a test pattern generator. The address generator generates multiple test addresses and, specifically, generates test addresses corresponding to all addresses in a predetermined maximum address space, which is associated with the specific type of memory under test and equal to a maximum number of banks in the memory multiplied by a maximum number of word lines per bank multiplied by a maximum decode number per data bit column. The test pattern generator generates test patterns to be applied to these test addresses in the memories under test. Then, the BIST engine sweeps through the address space of each memory, writing the test patterns to the test addresses. The output is then read and analyzed by comparison logic in an input/output interface, which allows for communication between the BIST engine and a corresponding memory under test, in order to confirm that the memory cells at the various test addresses in that corresponding memory are function properly.

Oftentimes, however, the memories tested by a given BIST engine may have address spaces that are less than the predetermined maximum address space associated with the specific type of memory under test and, specifically, may have a lesser number of banks than the predetermined maximum number of banks, a lesser number of word lines per bank than the predetermined maximum number of word lines per bank and/or a lesser decode number per data bit column than the predetermined maximum decode number per data bit column. To accommodate the overabundance of test addresses generated by the BIST engine in such cases and to enable in parallel testing of memories of different sizes (i.e., in parallel testing of memories with different total address spaces), each input/output interface block connected between the BIST engine and a corresponding memory is configured to sort in-range test addresses (i.e., test addresses that are received from the BIST engine and that are within the address space for the corresponding memory) from out-of-range test addresses (i.e., test addresses that are received from the BIST engine and that are above the address space for the corresponding memory). Although testing of memories of different sizes can be performed by such BIST circuits, sweeping the predetermined maximum address space can be a significant waste of time, particularly, when relatively small memories are tested.

SUMMARY

Disclosed herein are embodiments of an integrated circuit chip that comprises a plurality of memories and a built-in self-test (BIST) circuit for testing those memories. The BIST circuit can comprise a BIST engine that is electrically connected to multiple memories of the plurality of memories. This BIST engine can comprise an address generator and this address generator can dynamically set the size of the address space to be swept during testing. Specifically, the address generator can determine a superset of address space values indicating a highest number of banks in any of the multiple memories, a highest number of word lines per bank in any of the multiple memories and a highest decode number per data bit column in any of the multiple memories. Once the superset is determined, the address generator can generate test addresses for testing the multiple memories in parallel and these test addresses can specifically be generated such that they are all within a composite address space defined by the superset of address space values and, thereby within an address space that may, depending upon the actual configuration of the memories, be less than the predetermined maximum address space associated with such memories so as to reduce test time.

In each of the embodiments, the superset of address space values is determined based on information stored in input/output interface blocks connected between the BIST engine and the memories. Specifically, the BIST circuit can further comprise pairs of serially connected input/output interface blocks that electrically connect the multiple memories in parallel to the BIST engine. Each pair of serially connected input/output interface blocks comprises a first input/output interface block (e.g., a slow BIST input/output interface block (SBIO)) electrically connected to the BIST engine and a second input/output interface block (e.g., a fast BIST input/output interface block (FBIO)) electrically connected between the first input/output interface block and a corresponding memory. Each first input/output interface block in each pair can be programmed with a set of address space values for the corresponding memory and that set can indicate the number of banks in the corresponding memory, the number of word lines per bank in the corresponding memory and the decode number per data bit column for the corresponding memory.

The address generator can receive the sets of address space values for all of the multiple memories from all first input/output interface blocks and can determine the superset based on the sets. For example, each of the address space values (i.e., the number of banks in the corresponding memory, the number of word lines per bank in the corresponding memory and the decode number per data bit column for the corresponding memory) in a given set can be represented by a predetermined number of bits (e.g., three bits). Each first input/output interface block can store the bits and can comprise a group of multiplexers. The number of multiplexers in the group can be equal to the number of bits that are used to represent each address space value (e.g., a group of three multiplexers, when each address space value is represented by three bits). Each first input/output interface block can further comprise a first state machine, which controls the group of multiplexers. It should be noted that the first state machines in each of the first input/output interface blocks can be synchronously operated such that, following receipt of a reset signal, each first state machine outputs a first state signal, a second state signal, a third state signal and, optionally (as discussed in greater detail below with regard to a specific embodiment), an additional state signal, in sequence (i.e., during consecutive clock cycles following receipt of the reset signal).

The first state signal from the first state machine in a given first input/output interface block can cause the group of multiplexers in the that first input/output interface block to output, to the BIST engine, a group of first address space value signals (e.g., a group of three first address space value signals), which indicates the number of banks in the corresponding memory. The second state signal from the first state machine in the first input/output interface block can cause the group of multiplexers in that first input/output interface block to output, to the BIST engine, a group of second address space value signals (e.g., a group of three second address space value signals), which indicates the number of word lines per bank in the corresponding memory. The third state signal from the first state machine in the first input/output interface block can cause the group of multiplexers in that first input/output interface block to output, to the BIST engine, a group of third address space value signals (e.g., a group of three third address space value signals), which indicates the decode number per data bit column for the corresponding memory.

As mentioned above, optionally, in one specific embodiment the first state machine can further output an additional state signal. In this embodiment, groups of first address space value signals, groups of second address space value signals and groups of third address space value signals can be transmitted in sequence from the groups of multiplexers in the first input/output interface blocks to the BIST engine along specific signal lines otherwise used by the BIST circuit for communication of different BIST operational signals from the first input/output interface blocks (e.g., from the SBIOs) to the BIST engine. In this case, the additional state signal can allow the signal lines to return to their operational function and, specifically, can cause the multiplexers in each first input/output interface block to output different BIST operational signals, respectively, to the BIST engine during or after testing of the multiple memories.

Regardless of whether the signal lines used to communicate such information to the BIST engine are single-purpose signal lines (i.e., lines used to communicate only address space value signals to the BIST engine) or multi-purpose signal lines (i.e., lines used to communicate both address space value signals and operational signals to the BIST engine), the address generator can comprise comparison logic (e.g., OR logic) that compares the received groups of first address space value signals, compares the received groups of second address space value signals and compares the groups of third address space value signals from all the first input/output interface blocks, as they are received in order to determine the highest number of banks in any of the multiple memories, the highest number of word lines per bank in any of the multiple memories and the highest decode number per data bit column in any of the multiple memories, respectively, and thereby to determine the superset.

Also disclosed herein are embodiments of a built-in self-test (BIST) method for testing embedded memories. The method can comprise providing an integrated circuit chip, e.g., as described above, which comprises a plurality of memories and a built-in self-test (BIST) circuit for testing those memories. The BIST circuit can comprise a BIST engine that is electrically connected to multiple memories of the plurality of memories and that comprises an address generator. The method can further comprise determining, by the address generator, a superset of address space values, which indicates the highest number of banks in any of the multiple memories, the highest number of word lines per bank in any of the multiple memories and the highest decode number per data bit column for any of the multiple memories. The method can further comprise generating, by the address generator, test addresses for testing the multiple memories in parallel. This process of generating the test addresses can specifically be performed such that the test addresses are all within a composite address space defined by the superset of address space values and, thereby within an address space that may, depending upon the actual configuration of the memories, be less than the predetermined maximum address space associated with such memories so as to reduce test time.

BRIEF DESCRIPTION OF THE DRAWINGS

The embodiments herein will be better understood from the following detailed description with reference to the drawings, which are not necessarily drawn to scale and in which.

DETAILED DESCRIPTION

Figure 1A:
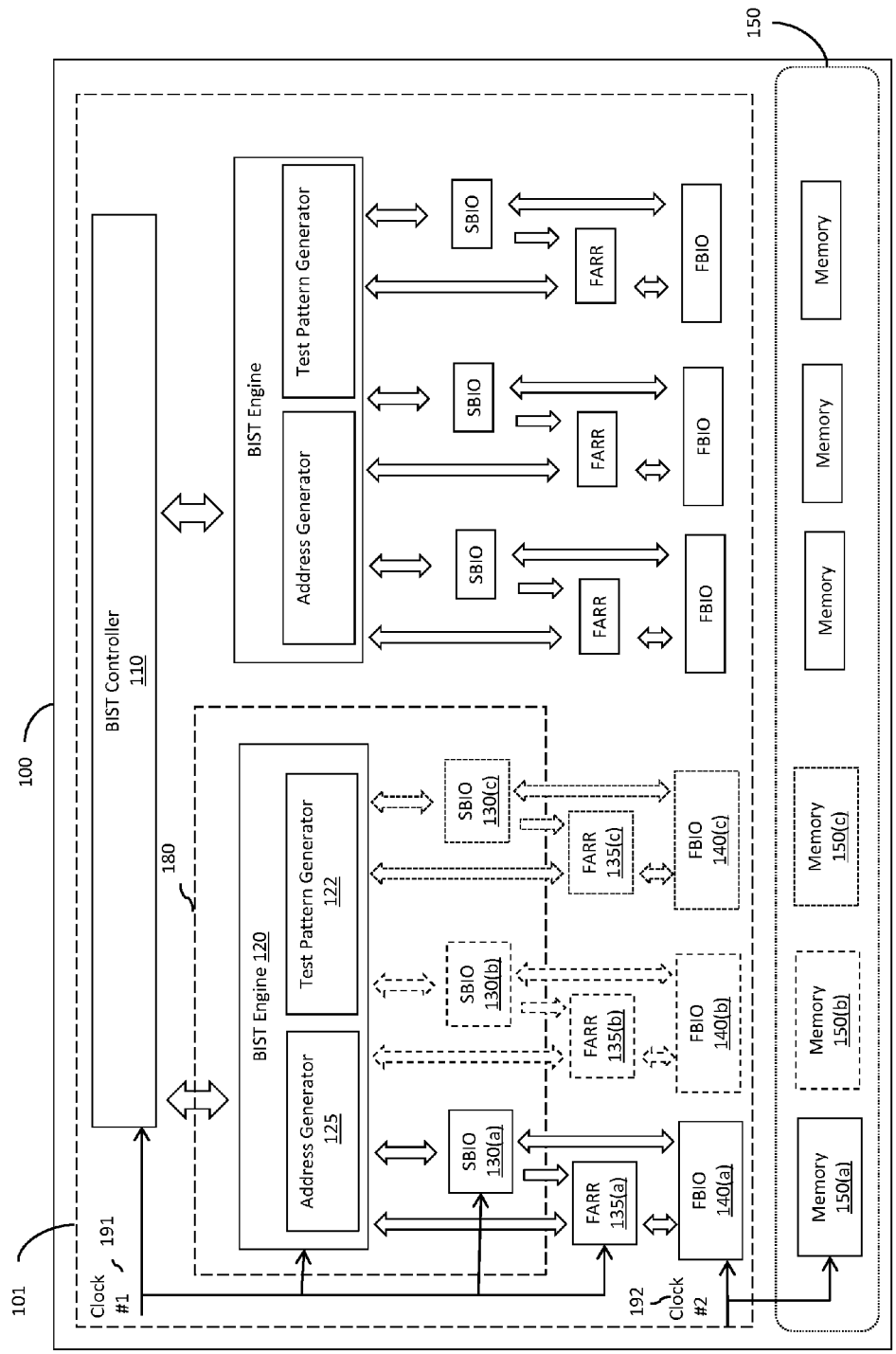
FIG. 1A is a schematic drawing illustrating an embodiment of integrated circuit chip with a built-in self-test (BIST) circuit for testing a plurality of memories.

As mentioned above, with advances in technologies and device scaling, integrated circuit chip designs incorporate an increasingly large number of embedded memories (also referred to herein as embedded memory arrays) as well as built-in self-test (BIST) circuits for testing such embedded memories, when operating in a test mode (as opposed to a functional mode). Oftentimes an integrated circuit chip design will incorporate multiple BIST engines controlled by a BIST controller and each BIST engine will test multiple embedded memories of the same specific type (e.g., multiple static random access memory arrays (SRAMs), multiple dynamic random access memory arrays (DRAMs), etc.) in parallel.

In this case, the BIST engine will comprise an address generator and a test pattern generator. The address generator generates multiple test addresses and, specifically, generates test addresses corresponding to all addresses in a predetermined maximum address space, which is associated with the specific type of memory under test and equal to a maximum number of banks multiplied by a maximum number of word lines per bank multiplied by a maximum decode number per data bit column. The test pattern generator generates test patterns to be applied to these test addresses in the memories under test. Then, the BIST engine sweeps through the address space of each memory, writing the test patterns to the test addresses. The output is then read and analyzed by comparison logic in an input/output interface, which allows for communication between the BIST engine and a corresponding memory under test, in order to confirm that the memory cells at the various test addresses in that corresponding memory are function properly.

Oftentimes, however, the memories tested by a given BIST engine may have address spaces that are less than the predetermined maximum address space for the specific type of memory under test and, specifically, may have a lesser number of banks than the predetermined maximum number of banks, a lesser number of word lines per bank than the predetermined maximum number of word lines per bank and/or a lesser decode number per data bit column than the predetermined maximum decode number per data bit column. To accommodate the overabundance of test addresses generated by the BIST engine in such cases and to enable in parallel testing of memories of different sizes (i.e., in parallel testing of memories with different total address spaces), each input/output interface block connected between the BIST engine and a corresponding memory is configured to sort in-range test addresses (i.e., test addresses that are received from the BIST engine and that are within the address space for the corresponding memory) from out-of-range test addresses (i.e., test addresses that are received from the BIST engine and that are above the address space for the corresponding memory). Although testing of memories of different sizes can be performed by such BIST circuits, sweeping the predetermined maximum address space can be a significant waste of time, particularly, when relatively small memories are tested.

In view of the foregoing, disclosed herein are embodiments of an integrated circuit chip with a built-in self-test (BIST) circuit for testing embedded compilable memories. This BIST circuit incorporates at least one BIST engine, which can test multiple memories in parallel and which can, prior to such testing, dynamically set the size of the address space to be swept during testing. Specifically, the BIST engine can comprise an address generator, which can determine a superset of address space values associated with all the memories to be tested. This superset indicates the highest number of banks in any of the memories, the highest number of word lines per bank in any of the memories and the highest decode number per data bit column in any of the memories. The address generator can then generate test addresses and can do so such that all of these test addresses are within a composite address space defined by the superset of address space values and, thereby within an address space that may, depending upon the actual configuration of the memories, be less than the predetermined maximum address space associated with such memories so as to reduce test time. Also disclosed herein are embodiments of a BIST method for testing embedded memories.

More particularly, referring to FIGS. 1A, 1B, 2 and 3 disclosed herein are embodiments of an integrated circuit chip 100. As illustrated in FIG. 1A, this integrated circuit chip 100 can comprise a plurality of memories 150 and a built-in self-test (BIST) circuit 101 for testing those memories 150.

Figure 1B:
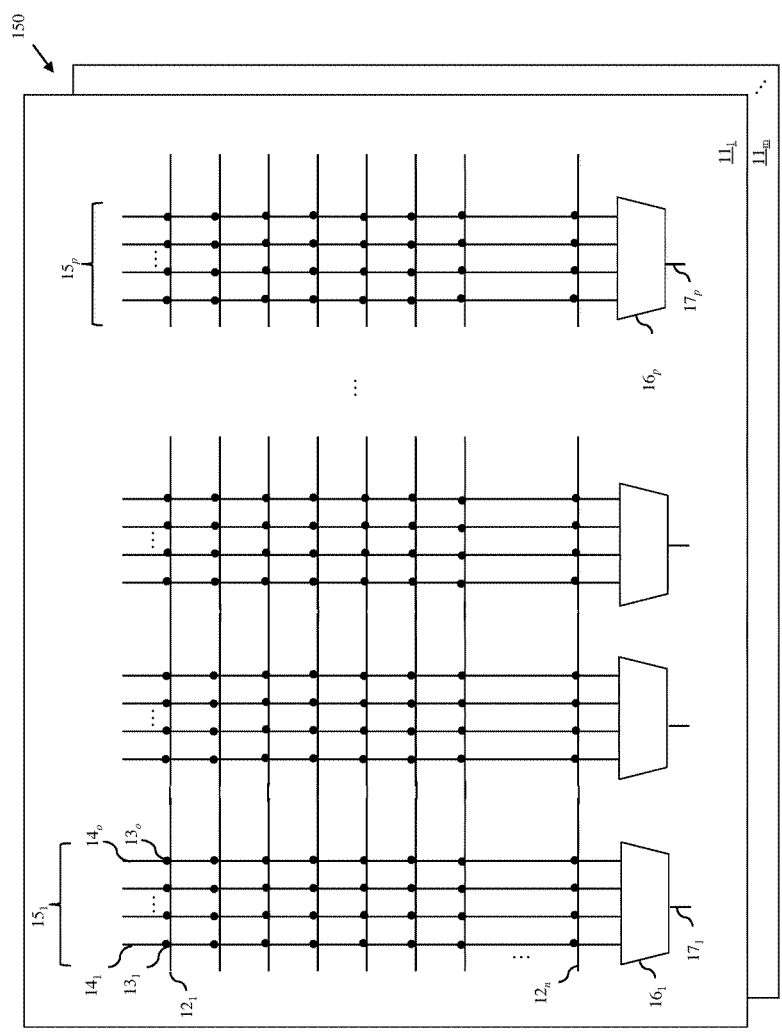
FIG. 1B is a schematic drawing illustrating an exemplary memory on the integrated circuit chip of FIG. 1A and suitable for testing by the BIST circuit.

As illustrated in FIG. 1B, each of the memories 150 can comprise one or more memory banks $11_1$-$11_m$, where the number m is the total number of banks and where each bank is essentially identical. Each memory bank $11_1$-$11_m$ can comprise one or more word lines $12_1$-$12_n$ (corresponding to rows), where the number n is the total number of word lines per bank. Each memory bank $11_1$-$11_m$ can also comprise one or more data bit columns $15_1$-$15_p$, where the number p is the total number of data bit columns per bank and where the data bit columns are essentially identical. Each data bit column $15_1$-$15_p$ can traverse the word lines $12_1$-$12_n$ so as to incorporate adjacent sections of the word lines $12_1$-$12_n$. Each data bit column $15_1$-$15_p$ can further comprise one or more memory cells $13_1$-$13_o$ electrically connected to each of those adjacent sections of the word lines $12_1$-$12_n$ and one or more bit lines $14_1$-$14_o$ (corresponding to columns) electrically connected to the memory cells $13_1$-$13_o$, respectively, at the adjacent sections of the word lines $12_1$-$12_n$. Thus, the number o corresponds to the number of memory cells electrically connected to each adjacent section of each word line in a data bit column as well as the corresponding number of bit lines connected to the memory cells in the data bit column. This number o is referred to herein as the decode number (i.e., a decode o). Each data bit column $15_1$-$15_p$ can, in the case of multiple bit lines (i.e., multiple columns) per data bit column, further comprise a corresponding multiplexer $16_1$-$16_p$ that receives, as inputs, signals from the bit lines $14_1$-$14_o$ and outputs a single data bit $17_1$-$17_p$, respectively. In such a memory, the number p of data bit columns is the same as the number p of single data bits output and is referred to as the data bit width. In order to read or write to the memory, a memory address of a set number of bits including bank address bits, which specify a particular one of the banks $11_1$-$11_m$, as well as word address bits and decode address bits, which in combination specify the same memory cell (i.e., the same particular word line and bit line intersection) to be accessed (i.e., read from or written to) in each of the data bit columns. The actual total address space is equal to the number m of banks multiplied by the number n of word lines per bank multiplied by the decode number o per data bit column.

For purposes of illustration, FIG. 1A shows an integrated circuit chip 100 having six discrete memories 150; however, it should be understood that the integrated circuit chip 100 can comprise any number of two or more memories 150. The BIST circuit 101 can comprise at least one BIST engine 120 controlled by a BIST controller 110. For illustration purposes, FIG. 1A shows two discrete BIST engines controlled by the BIST controller 110; however, it should be understood that this BIST circuit 101 could, alternatively, comprise any number of one or more BIST engines controlled by the BIST controller 110.

At least one BIST engine (e.g., BIST engine 120) in the BIST circuit 101 can be electrically connected to multiple memories of the plurality of memories 150 and can be configured to test those memories in parallel. For illustration purposes, the BIST engine 120 is shown in FIG. 1A as being electrically connected to three memories 150(a), 150(b) and 150(c)); however, it should be understood that BIST engine 120 could, alternatively, be electrically connected to any number of two or more memories.

These memories 150(a)-(c) can be the same type of memories and can be configured for example as illustrated in FIG. 1B. The memories 150(a)-(c) can all be dynamic random access memory (DRAM) arrays, static random access memory (SRAM) arrays, or any other specific type of memory arrays, etc. Each of these memories can further be associated with a predetermined maximum address space. For example, current state-of-the-art SRAM arrays have a maximum possible size of 16 banks, 512 word lines per bank and a decode number of 32 (i.e., a decode 32) and, thereby a maximum possible address space of 256,000 addresses.

These memories 150(a)-(c) can have the exact same configuration (e.g., the same number of banks, the same number of word lines per bank and the same decode number per data bit column such that they each have the same total address space. Alternatively, any two or more of the memories 150(a)-(c) can have different configurations (e.g., different numbers of banks, different numbers of word lines per bank and/or different decode numbers per data bit column) such that they have different total address spaces. For example, memories 150(a)-(c) can all comprise SRAM arrays and memory 150(a) can have 2 banks, each with 256 word lines and a decode number of 8 for a total address space of 4096 addresses; memory 150(b) can have 8 banks, each with 128 word lines and a decode number of 4 for a total address space of 4096 addresses; and memory 150(c) can have 4 banks, each with 16 word addresses and a decode number of 16 for a total address space of 1024 addresses.

As mentioned above, in prior art BIST circuits, the BIST engine would comprise an address generator that, during testing, generates test addresses sufficient to automatically sweep through a predetermined maximum address space (e.g., 256K addresses) of the specific type of memory under test, even though the actual memories being tested may have smaller total address spaces (e.g., 4096 addresses, 4096 addresses and 1024 addresses as in the memories 150(a), 150(b) and 150(c), respectively), thereby wasting test time.

In the present invention, the BIST engine 120 can comprise a test pattern generator 122 and an address generator 125. The address generator 125 can, like prior art address generators, be configured so as to be able to generate test addresses up to a predetermined maximum address space (e.g., 256K addresses); however, unlike in prior art address generators, the address generator 125 in the embodiments disclosed herein is also configured to dynamically set the size of the address space to be swept prior to testing, reducing it from the maximum possible address space, in order to reduce test time, if appropriate (e.g., when all of the memories have relatively small total address spaces). That is, the address generator 125 in the embodiments disclosed herein can determine (i.e., can be adapted to determine, can be configured to determine, etc.) if a lesser number of test addresses could be generated for testing the specific memories 150(a)-(c) connected to the BIST engine 120 and, if so, can generate (i.e., can be adapted to generate, can be configured to generate, etc.) only that lesser number of test addresses. To accomplish this, the address generator 125 can determine (i.e., can be adapted to determine, can be configured to determine, etc.) a superset of address space values indicating a highest number of banks in any of the multiple memories 150(a)-(c), a highest number of word lines per bank in any of the multiple memories 150(a)-(c) and a highest decode number per data bit column in any of the multiple memories 150(a)-(c). For example, the address generator 125 can determine that memory 150(a) has 2 banks, memory 150(b) has 8 banks and memory 150(c) has 4 banks and, thus, the highest number of banks in any of the memories 150(a)-(c) is 8 in memory 150(b). The address generator 125 can further determine that memory 150(a) has 256 word lines per bank, memory 150(b) has 128 word lines per bank and memory 150(c) has 16 word lines per bank and, thus, the highest number of word lines per bank in any of the memories 150(a)-(c) is 256 in memory 150(a). Finally, the address generator 125 can determine that memory 150(a) has a decode number of 8 per data bit column (i.e., a decode 8), memory 150(b) has a decode number of 4 per data bit column (i.e., a decode 4) and memory 150(c) has a decode number of 16 per data bit column (i.e., a decode 16) and, thus, the highest decode number per data bit column (i.e., the highest decode number) in any of the memories 150(a)-(c) is a decode 16 in memory 150(c). Consequently, the address generator 125 can determine that the superset of address space values for the memories 150(a)-(c) is 8 banks, 256 word lines per bank and a decode 16. This superset defines an address space of 32,768 addresses. Once the superset is determined, the address generator 125 can generate test addresses for testing the multiple memories in parallel and these test addresses can specifically be generated such that they are all within the address space that is defined by the superset and, thereby within an address space that may, depending upon the actual configuration of the memories, be less than the predetermined maximum address space so as to reduce test time. In the example provided herein, since the superset of address space values for the memories 150(a)-(c) defines an address space of 32,768 addresses and since the predetermined maximum address space associated is 256K addresses, the address generator 125 will generate significantly fewer test addresses than the maximum possible address space, thereby significantly reducing the test time.

More specifically, as illustrated in FIG. 1A and discussed above, the BIST circuit 101 can comprise at least one BIST engine 120 controlled by a BIST controller 110. The BIST circuit 101 can further comprise pairs of serially connected input/output interface blocks that electrically connect the multiple memories 150(a)-(c) in parallel to the BIST engine 120 and that enable communication between the BIST engine 120 and the multiple memories 150(a)-(c). Each pair 130(a)/140(a), 130(b)/140(b), 130(c)/140(c) of serially connected input/output interface blocks can comprise a first input/output interface block 130(a), 130(b), 130(c) (e.g., a slow BIST input/output interface block (SBIO)) electrically connected to the BIST engine 120 and a second input/output interface block 140(a), 140(b), 140(c) (e.g., a fast BIST input/output interface block (FBIO)) electrically connected between the first input/output interface block 130(a), 130(b), 130(c) and a corresponding memory 150(a), 150(b), 150(c), respectively. The BIST circuit 101 can further comprise failing address and repair registers (FARRs) 135(a)-(c), which are in communication with the first input/output interface blocks 130(a)-(c) and the second input/output interface blocks 140(a)-(c), respectively, and which are also in communication with the BIST engine 120. The BIST controller 110, the BIST engine 120, the first input/output interface blocks 130(a)-(c) and the FARRs 135(a)-(c) can all be controlled by a common first clock signal 191. The memories 150(a)-(c) and the second input/output interface blocks 140(a)-(c) can be controlled by a common second clock signal 192, which is faster than the first clock signal. For example, the second clock signal 192 can be an at-speed functional clock such that BIST operations that are performed with respect to the memories 150(a)-(c) are performed at-speed.

As in a conventional BIST circuit, the BIST engine 120 of the BIST circuit 101 can comprise an address generator 125 for generating test addresses and a test pattern generator 122 for generating test patterns. The BIST engine 120 can, via the pairs of input/output interface blocks, sweep through the address spaces of each memory 150(a)-(c), writing the test patterns to the memory cells in those memories 150(a)-(c) at those test addresses. The BIST engine 120 can subsequently cause the memory cells at those test addresses in the memories 150(a)-(c) to be read and the data out to be analyzed by comparison logic in the second input/output interface block 140(a)-(c) in order to detect any faulty memory cells in any of the memories 150(a)-(c). Upon detection of faulty memory cells in any the memories 150(a)-(c), the corresponding FARRs 135(a)-(c) can register the failing addresses and can calculate appropriate repair solutions.

It should be noted that the use of both slow and fast input/output interface blocks (i.e., a SBIO and a FBIO) between the BIST engine 120 and each corresponding memory 150(a)-(c) allows the BIST engine 120 and the memories 150(a)-(c) to run at the different clock speeds of the clock signals 191-192. In general, running any logic at a high clock speed requires more power than running at a low clock speed. During test, the memories 150(a)-(c) must be run at their designed clock rate, which is typically relatively high, in order to verify that they will not fail even at the highest clock rate specified. However, since there is no advantage to running the complex BIST engine 120 at the same clock rate as the memories 150(a)-(c) and since running the BIST engine 120 at a high clock speed wastes power, the two different clock signals 191-192 are used and the SBIO and FBIO provide the required support for interfacing the logic across the clock domains and also perform memory specified operations at the same time. Additionally, it should be understood that the general features of BIST circuit, as described within this paragraph, for testing multiple memories in parallel following test address generation are well known in the art and, thus, the details thereof are omitted from this specification in order to allow the reader to focus on the salient aspects of the disclosed.

In any case, in each of the embodiments of the integrated circuit chip 100 disclosed herein, the superset of address space values is determined by the BIST engine 120 and, particularly, by the address generator 125 based on information stored in the input/output interface blocks and, particularly, based on information stored in the first input/output interface blocks 130(a)-(c) connected between the BIST engine 120 and the memories 150(a)-(c). That is, first input/output interface block 130(a)-(c) in each pair of input/output interface blocks connected to the BIST engine 120 can be programmed with a set of address space values for the corresponding memory 150(a)-(c), respectively. This set can indicate the number of banks in the corresponding memory, the number of word lines per bank in the corresponding memory and the decode number per data bit column in the corresponding memory. Each of the different address space values in a set can be represented by a specific number of bits and these bits can be stored, for example, in single-use storage devices (e.g., fuses, anti-fuses, etc.) (i.e., these bits can be hard programmed in the corresponding first input/output interface block) or stored in any other suitable storage device within the corresponding first input/output interface block. Those skilled in the art will recognize that conventional SBIOs are known to store this information so that test logic contained therein can recognize when test addresses received from a BIST engine during an address sweep for a write or read process go "out-of-bounds" (i.e., are outside the address space) for the corresponding memory. In the embodiments of the integrated circuit chip disclosed herein, this information is not only used by the test logic to determine when test addresses received from the BIST engine 120 during an address sweep go out-of-bounds, but also to limit, if possible, the number of test addresses generated by the address generator 125 for that address sweep.

Figure 2:
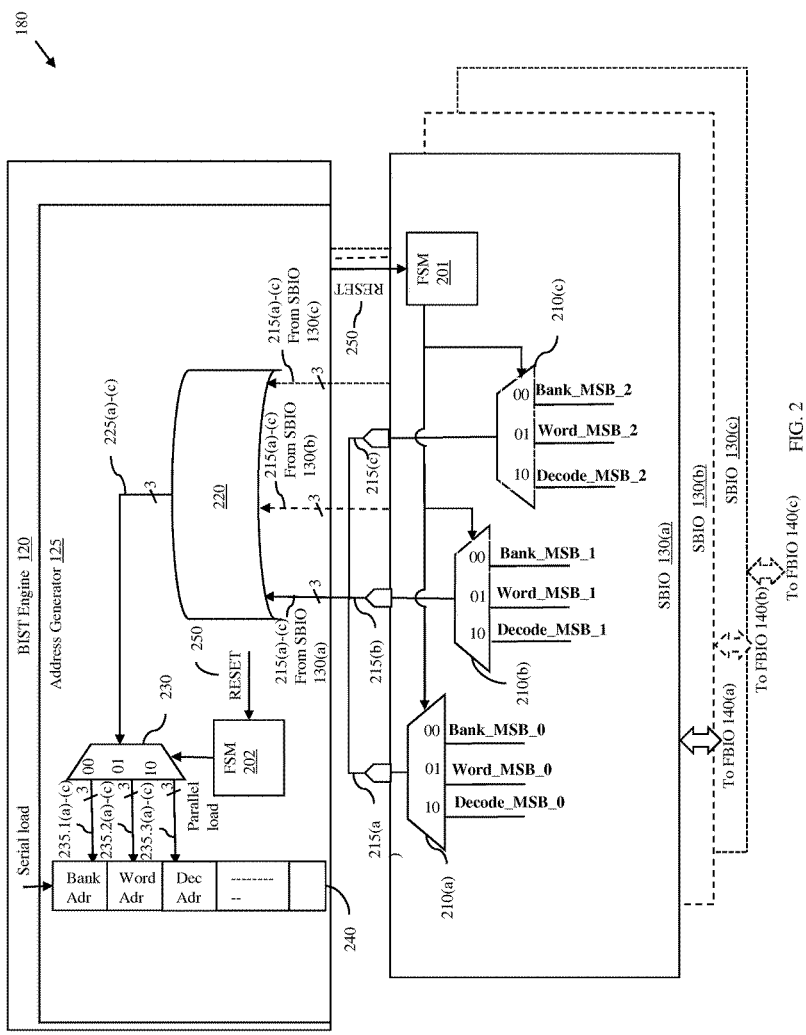
FIG. 2 is a schematic diagram illustrating in greater detail a portion of the BIST circuit of FIG. 1A, including a BIST engine and first input/output interface blocks.
Figure 3:
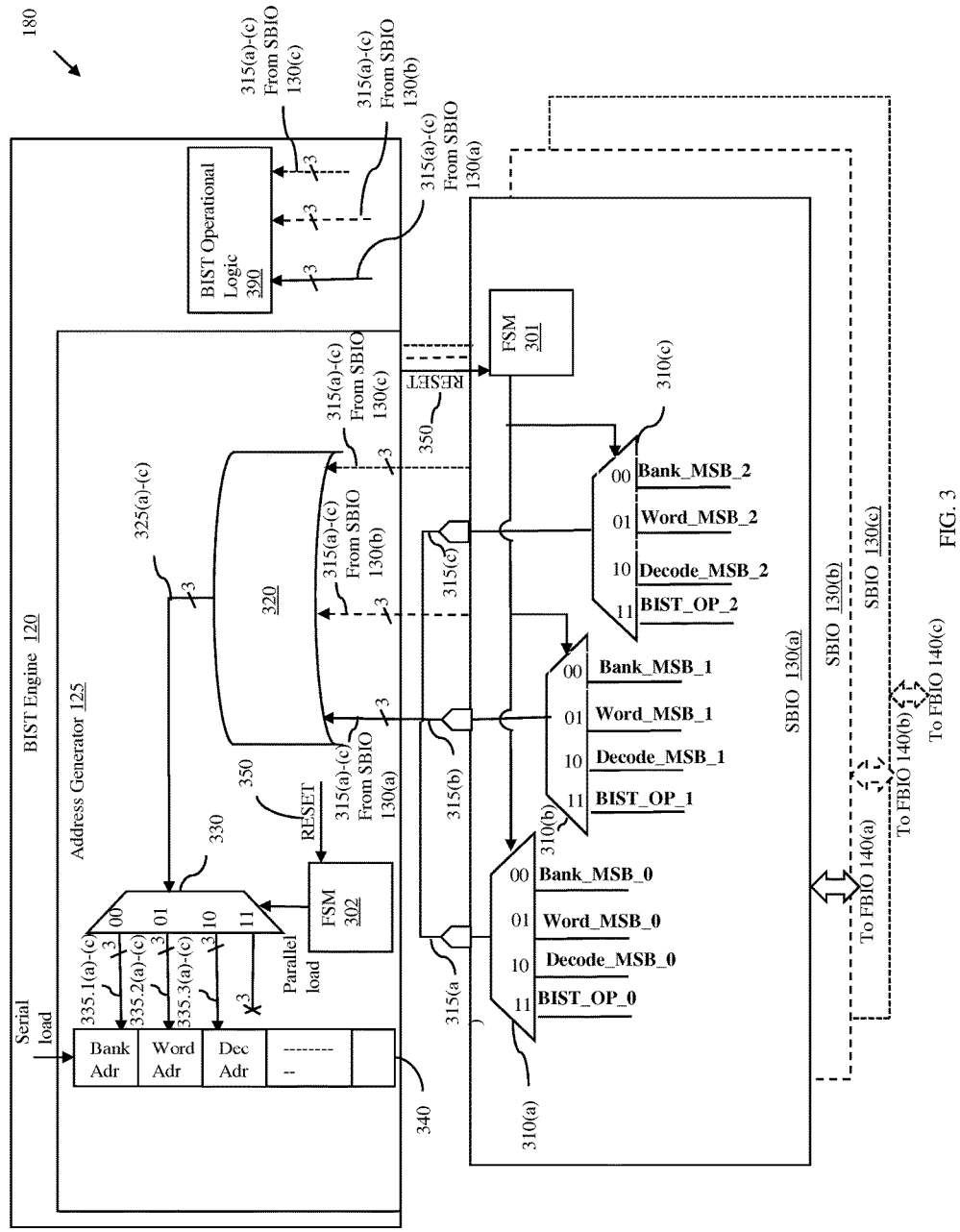
FIG. 3 is a schematic diagram illustrating in greater detail an alternative configuration for the same portion of the BIST circuit of FIG. 1A, including a BIST engine and first input/output interface blocks.

To accomplish this, the portion 180 of the BIST circuit 101, including the BIST engine 120 and first input/output interface blocks 130(a)-(c) can be configured, for example, as illustrated in FIG. 2 or, alternatively, as illustrated in FIG. 3. Referring to FIG. 2 and FIG. 3, in either case the address generator 125 in the BIST engine 120 can receive the sets of address space values for the multiple memories 150(a)-(c) from the first input/output interface blocks 130(a)-(c), respectively, and can determine the superset of address space values based on these sets. For example, each of the address space values (i.e., the number of banks in the corresponding memory, the number of word lines per bank in the corresponding memory and the decode number per data bit column in the corresponding memory) in a given set in a given first input/output interface device can be represented by a predetermined number of bits. This predetermined number of bits can be all of the address bits associated with each address space value or less than all of those address bits (e.g., only the three most significant bits (MSBs)). More specifically, those skilled in the art will recognize that, for a memory address in a compilable memory, the total number of address bits required to cover all possible addresses will depend upon the maximum number of banks, the maximum number of word lines per bank and the maximum decode number. For example, for SRAMs that could have up to 16 banks, up to 512 word lines, up to a decode 32 and, thereby 256,000 possible addresses, the memory address would require a total of 18 bits: 4 bits to specify the bank address (e.g., address bits [3:0]); 9 bits to specify the word address (e.g., word address [12:4]); and 5 bits to specify the decode address (e.g., decode address [17:13]). Thus, the predetermined number of bits can be all of these address bits or, alternatively, can be a specified number (e.g., 3) of the MSBs of the bank address (e.g., bank address bits [3:1]), a specified number (e.g., 3) of the MSBs of the word address (e.g., word address bits [12:10]); and a specified number (e.g., 3) of the MSBs of the decode address (e.g., decode address bits [17:15]).

For purposes of illustration, the invention will be described in greater detail using only the three MSBs of each of the address space values. In FIGS. 2 and 3, the three MSBs that represent the number of banks in the corresponding memory are named Bank_MSB_0, Bank_MSB_1, and Bank_MSB_2; the three MSBs that represent the number of word lines per bank in the corresponding memory are named Word_MSB_0, Word_MSB_1, and Word_MSB_2; and the three MSBs that represent the decode number per data bit column in the corresponding memory are named Decode_MSB_0, Decode_MSB_1, and Decode_MSB_2.

In any case, the first input/output interface block 130(a)-(c) can store the address space value bits and can comprise a group of multiplexers 210(a)-(c), 310(a)-(c) electrically connected to the storage devices for the address space value bits. The number of multiplexers in the group can be equal to the number of bits that are used to represent each address space value (e.g., a group of three multiplexers, as illustrated in FIG. 2 and in FIG. 3, when each address space value is represented by three MSBs 0, 1, and 2). The electrical connections between the multiplexers 210(a)-(c), 310(a)-(c) and the storage devices storing the address space value bits can be such that one multiplexer 210(a), 310(a) receives, as inputs, Bank_MSB_0, Word_MSB_0 and Decode_MSB_0, one multiplexer 210(b), 310(b) receives, as inputs, Bank_MSB_1, Word_MSB_1 and Decode_MSB_1, and one multiplexer 210(c), 310(c) receives, as inputs, Bank_MSB_2, Word_MSB_2 and Decode_MSB_2.

Each first input/output interface block 130(a)-(c) can further comprise a first state machine 201, 301, which controls all of the multiplexers in the group of multiplexers 210(a)-(c), 310(a)-(c) contained therein. The first state machines 201, 301 in all of the first input/output interface blocks 130(a)-(c) can be synchronously operated. Specifically, each first state machine 201, 301 in each first input/output interface blocks 130(a)-(c) can receive a BIST reset signal 250, 350 from the BIST engine 120. This BIST reset signal 250, 350 can indicate the start of a test mode (as opposed to a normal operation mode). During consecutive clock cycles of the first clock signal 191 following receipt of the BIST reset signal 250, 350, each first state machine 201, 301 can output a first state signal (e.g., 00), a second state signal (e.g., 01), a third state signal (e.g., 10) and, optionally (as discussed in greater detail below with regard to the alternative configuration for the portion 180 of the BIST circuit 101 shown in FIG. 3), an additional state signal (e.g., 11), in sequence.

Within each first input/output interface block 130(a)-(c), the first state signal (e.g., 00) from the first state machine 201, 301 can cause the group of multiplexers 210(a)-(c), 310(a)-(c) contained therein to output, to the BIST engine 120 along the signal lines 215(a)-(c), 315(a)-(c) in a return bus, a group of first address space value signals, which indicates the number of banks in the corresponding memory 150(a)-(c). For example, in response to the first state signal, the multiplexers 210(a)-(c), 310(a)-(c) can transmit first address space value signals for Bank_MSB_0, Bank_MSB_1, and Bank_MSB_2 along signal lines 215(a)-(c), 315(a)-(c), respectively. The second state signal (e.g., 01) from the first state machine 201, 301 can cause the group of multiplexers 210(a)-(c), 310(a)-(c) contained therein to output, to the BIST engine 120 along the signal lines 215(a)-(c), 315(a)-(c) in the return bus, a group of second address space value signals, which indicates the number of word lines per bank in the corresponding memory 150(a)-(c). For example, in response to the second state signal, the multiplexers 210(a)-(c), 310(a)-(c) can transmit second address space value signals for Word_MSB_0, Word_MSB_1, and Word_MSB_2 along signal lines 215(a)-(c), 315(a)-(c), respectively. The third state signal (e.g., 10) from the first state machine 201, 301 can cause the group of multiplexers 210(a)-(c), 310(a)-(c) contained therein to output, to the BIST engine 120 along the signal lines 215(a)-(c), 315(a)-(c) in the return bus, a group of third address space value signals, which indicates the decode number per data bit column in the corresponding memory 150(a)-(c). For example, in response to the third state signal, the multiplexers 210(a)-(c), 310(a)-(c) can transmit third address space signals for Decode_MSB_0, Decode_MSB_1, and Decode_MSB_2 along signal lines 215(a)-(c), 315(a)-(c), respectively. It should be understood that, since the first state machines 201, 301 in each first input/output interface block 130(a)-(c) are synchronously operated, the BIST engine 120 will essentially simultaneously receive, along signal lines 215(a)-(c), 315(a)-(c) in corresponding return buses to the BIST engine 120, groups of first address space values from all of the first input/output interface blocks 130(a)-(c) indicating the numbers of banks in each of the memories 150(a)-(c) connected to those first input/output interface blocks 130(a)-(c), followed by groups of second address space values from all of the first input/output interface blocks 130(a)-(c) indicating the numbers of word addresses in each of the memories 150(a)-(c) connected to those first input/output interface blocks 130(a)-(c), followed by groups of third address space values from all of the first input/output interface blocks 130(a)-(c) indicating the decode numbers of each of the memories 150(a)-(c) connected to those first input/output interface blocks 130(a)-(c).

It should also be understood that, in addition to more multiplexers, more state signals would be required to move more than the three MSBs of each of the bank address bits, word address bits and decode address bits to the BIST engine 120.

As mentioned above, optionally, in one specific embodiment, as illustrated in FIG. 3, the first state machine 301 can further output an additional state signal (e.g., 11). In this embodiment, the additional hardware and chip area required to implement the invention is limited because it provides for multi-purposing of signal lines 315(a)-(c). That is, the groups of first address space value signals, groups of second address space value signals and groups of third address space value signals can be transmitted, in sequence as discussed above, from the groups of multiplexers 310(a)-(c) in each of the first input/output interface blocks 130(a)-(c) to the BIST engine 120 along specific signal lines 315(a)-(c), which are otherwise used by the BIST circuit 101 for communication of different BIST operational signals from the first input/output interface blocks 130(a)-(c) (e.g., from the SBIOs) to the BIST engine 120 during or after testing. Specifically, in this embodiment, in each first input/output interface block 130(a)-(c), the multiplexer 310(a) can further receive a first BIST operational signal (BIST_OP_0), as an input; the multiplexer 310(b) can further receive a second BIST operational signal (BIST_OP_1), as an input; and the multiplexer 310(c) can further receive a third BIST operational signal (BIST_OP_2), as an input. The first BIST operational signal could comprise, for example, BIEXIST. Those skilled in the art will recognize that the BIEXIST signal is typically used to enable testing. That is, it is an "enable" signal, which is transmitted by each SBIO to a BIST engine to indicate that the SBIO, the downstream logic and the corresponding memory are enabled for testing. The second BIST operational signal could comprise, for example, SBSHIFT. Those skilled in the art will recognize that the SBSHIFT signal is typically used during diagnostics after running the test patterns. If there is a fail detected by the comparison logic, the SBSHIFT signal switches high, causing necessary information from the BIST engine (e.g., Addr, pattern number, data bit failed, etc.) are shifted out for diagnostics purpose. The third BIST operational signal could comprise, for example, SBSTOP. Those skilled in the art will recognize that the SBSTOP signal is typically used as a "handshaking" signal between the BIST engine and SBIO, indicating to the BIST engine that a memory operation is complete and that the BIST engine can send the next instruction (read/write) to memory.

In any case, the additional state signal (e.g., 11) can allow the signal lines 315(a)-(c) to return to their operational function and, specifically, can cause the group of multiplexers 310(a)-(c) contained in each first input/output interface block 130(a)-(c) to output to the BIST engine 120 along the signal lines 315(a)-(c) in a return bus, a group of BIST operational signals. For example, in response to the additional state signal, the multiplexers 310(a)-(c) can transmit BIST operational signals BIST_OP_0 (e.g., BIEXIST), BIST_OP_1 (e.g., SBSHIFT), and BIST_Op_2) (e.g., SBSTOP) along signal lines 315(a)-(c), respectively.

Referring again to FIGS. 2 and 3, regardless of whether the signal lines used to communicate such information to the BIST engine are single-purpose signal lines (i.e., see signal lines 215(a)-(c) used to communicate only address space value signals to the BIST engine 120 in FIG. 2) or multi-purpose signal lines (i.e., see signal lines 315(a)-(c) used to communicate both address space value signals and BIST operational signals to the BIST engine 120 in FIG. 3), the address generator 125 can comprise comparison logic 220, 320 (e.g., OR logic); an address mask register 240, 340; a parallel load register 230, 330 that is electrically connected between the comparison logic 220, 320 (e.g., the OR logic) and the address mask register 240, 340; and a second state machine 202, 302, which controls the parallel load register 230, 330. The second state machine 202, 302 can be synchronously operated with the first state machines 201, 301 in the first input/output interface blocks 130(a)-(c). That is, the second state machine 202, 302 can also receive the BIST reset signal 250, 350 and, during consecutive clock cycles of the first clock signal 191 following receipt of the BIST reset signal 250, 350, can output a first state signal (e.g., 00), a second state signal (e.g., 01), a third state signal (e.g., 10) and, optionally (e.g., as shown in FIG. 3), an additional state signal (e.g., 11), in sequence.

The comparison logic 220, 320 can compare the received groups of first address space value signals from all the first input/output interface blocks 130(a)-(c) when they are received in order to determine the highest number of banks in any of the memories 150(a)-(c), can compare the received groups of second address space value signals from all the first input/output interface blocks 130(a)-(c) as they are received in order to determine the highest number of word lines in any of the memories 150(a)-(c) and can compare the received groups of third address space value signals from all the first input/output interface blocks 130(a)-(c) as they are received in order to determine the highest decode number per data bit column in any of the memories 150(a)-(c), thereby determining the superset of address space values. Specifically, the comparison logic 220, 320 can be electrically connected to the signal lines 215(a)-(c), 315(a)-(c) from each of the first input/output interface blocks 130(a)-(c), receiving the signals transmitted along those signal lines 215(a)-(c), 315(a)-(c) from each of the first input/output interface blocks, as inputs. Thus, the comparison logic 220, 320 can essentially simultaneously receive, from the first input/output interface blocks 130(a)-(c), the groups of first address space value signals, which indicate the numbers of banks in the memories 150(a)-(c), can compare those groups of first address space value signals and can output, along signal lines 225(a)-(c), 325(a)-(c) to the parallel load register 230, 330, one selected group of first address space value signals, which indicates the highest number of banks in any of the memories 150(a)-(c). In the next clock cycle, the comparison logic 220, 320 can essentially simultaneously receive, from the first input/output interface blocks 130(a)-(c), the groups of second address space value signals, which indicate the numbers of word lines in each bank in the memories 150(a)-(c), can compare those groups of second address space value signals and can output, along signal lines 225(a)-(c), 325(a)-(c) to the parallel load register 230, 330, one selected group of second address space value signals, which indicates the highest number of word lines in any of the memories 150(a)-(c). In the next clock cycle, the comparison logic 220, 320 can essentially simultaneously receive, from the first input/output interface blocks 130(a)-(c), the groups of third address space value signals, which indicate the decode numbers per data bit column in the memories 150(a)-(c), can compare those groups of third address space value signals and can output, along the signal lines 225(a)-(c), 325(a)-(c) to the parallel load register 230, 330, one selected group of third address space value signals, which indicates the highest decode number per data bit column in any of the memories 150(a)-(c).

The parallel load register 230, 330 can comprise, for example, a serial-in/parallel out shift register. This parallel load register 230, 330 can receive the selected group of first address space value signals from the comparison logic 220, 320 and can load those first address space values (i.e., the highest number of banks in any of the memories 150(a)-(c)) along signal lines 235.1(a)-(c), 335.1(a)-(c) into the address mask register 240, 340 in response to the first state signal (e.g., 00) from the second state machine 202, 302. After receiving the selected group of first address space values, the parallel load register 230, 330 can further receive the selected group of second address space values signals from the comparison logic 220, 320 and can load those second address space values (i.e., the highest number of word lines per bank in any of the memories 150(a)-(c)) into the address mask register 240, 340 along signal lines 235.2(a)-(c), 335.2(a)-(c) in response to the second state signal (e.g., 01) from the second state machine 202, 302. After receiving the selected group of second address space values, the parallel load register 230, 330 can further receive the selected group of third address space value signals from the comparison logic 220, 320 and can load those third address space values (i.e., the highest decode number per data bit column in any of the memories 150(a)-(c)) into the address mask register 240, 340 along signal lines 235.3(a)-(c), 335.3(a)-(c) in response to the third state signal (e.g., 10) from the second state machine 202, 302.

It should be noted that, in the alternative configuration shown in FIG. 3, the BIST operational signals BIST_OP_0 (e.g., BIEXIST), BIST_OP_1 (e.g., SBSHIFT), and BIST_Op_2) (e.g., SBSTOP), which are output to the BIST engine 120 along the signal lines 315(a)-(c) by the multiplexers 310(a)-(c), respectively, in each first input/output interface block 130(a)-(c) can be received and processed, as appropriate, by BIST operational logic 390. This BIST operational logic 390 is not active during the initial phase following the reset signal (i.e., during the first three clock when the bank address MSBs, the word address MSBs, and the decode address MSBs, respectively, are received by the BIST engine 120). Instead it becomes active and processes the BIST operational signals only after the initial phase. These BIST operational signals BIST_OP_0 (e.g., BIEXIST), BIST_OP_1 (e.g., SBSHIFT), and BIST_Op_2) (e.g., SBSTOP) can also be processed by the comparison logic 320 and parallel load register 330; however, since these signals are not relevant to the address space of the memories 150(a)-(c), signals transmitted along signal lines 335.4(a)-(c) in response to the additional state signal (e.g., 11) can be terminated.

Once the superset of address space values (i.e., the highest number of banks in any of the memories 150(a)-(c), the highest number of word lines per bank in any of the memories 150(a)-(c) and the highest decode number per data bit column in any of the memories 150(a)-(c)) is loaded into the address mask register 240, 340, the address mask register 240, 340 can ensure that any possible test addresses, which are within the predetermined maximum address space (e.g., 256K addresses) and which have address space values that are above the highest number of banks, the highest number of word addresses and/or the highest decode number per data bit column, will be masked during generation of the test addresses.

More specifically, the address mask register 240, 340 can be equal in width to the address bus of the memory. The address mask register 240, 340 is typically accessible for programming in the manufacturing test mode and is typically programmed at that time to a default setting that will allow the address generator 125 to generate test addresses for predetermined maximum address space of the specific type of memory under test, unless otherwise programmed. By loading the superset of address space values into the address mask register 240, 340, the address mask register 240, 340 is being dynamically programmed immediately prior to test so that a lesser number of test addresses can be generated, if possible. That is, once the superset of address space values is loaded into the address mask register 240, 340, the address generator 125 begins generating test addresses and, when doing so, constantly compares the generated addresses with the loaded superset of address space values in the address mask register 240, 340 and stops generation accordingly. That is, the address generator 125 will prevent generation of any test addresses that reference a bank number above the highest number of banks in the superset, that reference a word address above the highest number of word lines in the superset, and/or that reference a decode number above the highest decode number per data bit column in the superset.

Thus, for example, if the memories 150(*a*)-(*c*) comprise SRAMs that could have up to 16 banks, up to 512 word lines, up to a decode 32 and, thereby up to 256,000 possible addresses such that the total memory address would have 18 bits and the address bus will be 18 bits wide: 4 bits to specify the bank address (e.g., address bits [3:0]); 9 bits to specify the word address (e.g., address [12:4]); and 5 bits to specify the decode address (e.g., address bits [17:13]), the three MSBs for each address space value associated with each memory 150(*a*)-(*c*) will be as follows. For memory 150(*a*) having 2 banks, 256 word lines and a decode number of 8, the three bank MSBs [3:1] would be 000, the three word line MSBs [12:10] would be 011 and the three decode MSBs [17:15] would be 001. For memory 150(*b*) having 8 banks, 128 word lines and a decode number of 4, the three bank MSBs [3:1] would be 011, the three word line MSBs [12:10] would be 001 and the three decode MSBs [17:15] would be 000. For memory 150(*c*) having 4 banks, 16 word lines and a decode number of 16, the three bank MSBs [3:1] would be 001, the three word line MSBs [12:10] would be 000 and the three decode MSBs [17:15] would be 011. In this case, the three bank MSBs 011 associated with the memory 150(*b*) would indicate the highest number of banks, would be output from the comparison logic 220, 320 and would be loaded into the address mask register 240, 340; the three word line MSBs 011 associated with the memory 150(*a*) would indicate the highest number of word lines, would be output from the comparison logic 220, 320 and would be loaded into the address mask register 240, 340; and the three decode MSBs 011 associated with the memory 150(*c*) would indicate the highest decode number, would be output from the comparison logic 220, 320 and would be loaded into the address mask register 240, 340. Thus, the address mask register 240, 340 would prevent generation by the address generator 125 of any test addresses where the three bank MSBs [3:1] are above 011, where the three word line MSBs [10:12] are above 110, and/or where the three decode MSBs [15:17] are above 110.

It should be noted that, since in the embodiment described above each SBIO only forwards a predetermined number of MSBs associated with each address space value to the BIST engine 120, the highest number determination for each address space value made by the comparison logic 220, 320 and subsequent address masking performed using the address mask register 240, 340 will be limited to the highest number as indicated by the MSBs. For example, if 4 bits (e.g., [3:0]) are used to specify the bank address and only three bank MSBs (e.g., [3:1]) are considered, then even if all the memories have less than two banks (e.g., 1 bank) only bank addresses above address 1 (i.e., above the second bank) are masked. Similarly, if 9 bits (e.g., [12:4]) are used to specify the word address and only three MSBs (e.g., [12:10]) are considered, then even if all of the memories have less than 128 word lines, only word addresses above address 127 are masked. Similarly, if 5 bits (e.g., [17:13]) are used to specify the decode address and only three MSBs (e.g., [17:15]) are considered, then even if all of the memories have a decode number of less than 8, only decode addresses above address 7 are masked. It should be understood that in the above-description assignment of bank, word and decode addresses begins at 0. For example, for 2 bank addresses, counting starts at "0" and the bank address range is 0 to 1; for 128 word addresses, counting starts at "0" and the word address range is 0 to 127; for 8 decode addresses, counting starts at "0" and the decode address range is 0 to 7.

The BIST engine 120 can then, via the pairs of input/output interface blocks, sweep through the address spaces of each memory 150(*a*)-(*c*), writing the test patterns to the generated test addresses in those memories 150(*a*)-(*c*). The BIST engine 120 can subsequently cause those test addresses to be read and the data out to be analyzed in order to detect any faulty memory cells in the memories 150(*a*)-(*c*).

Figure 4:
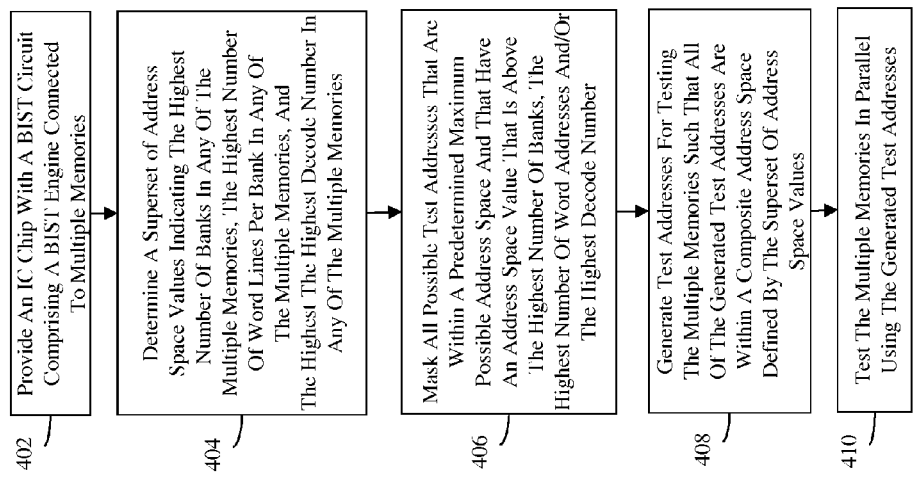
FIG. 4 is a flow diagram illustrating an embodiment of a BIST method for testing a plurality of memories on an integrated circuit chip.

Referring to FIG. 4, disclosed herein are embodiments of a built-in self-test (BIST) method for testing embedded memories. The method can comprise providing an integrated circuit chip, e.g., as illustrated in FIG. 1A, which comprises a plurality of memories 150 (e.g., configured as illustrated in FIG. 1B) and a built-in self-test (BIST) circuit 101 for testing those memories 150 (402). As discussed in detail above, the BIST circuit 101 can comprise a portion 180 that is configured as shown in FIG. 2 or as shown in FIG. 3. In either case, the BIST circuit 101 can comprise at least one BIST engine 120 that is electrically connected to multiple memories 150(*a*)-(*c*) of the plurality of memories 150 and that comprises an address generator 125. The multiple memories 150(*a*)-(*c*) can all be the same specific type of memory (e.g., a static random access memory (SRAM) array, a dynamic random access memory (DRAM) array, etc.). This specific type of memory can have predetermined maximum address space (e.g., 256K addresses) and the address generator 125 can be configured to generate test addresses up to that predetermined maximum address space. However, any one or more of the multiple memories 150(*a*)-(*c*) may actually be configured to a have a total address space that is less than the predetermined maximum address space for the specific type of memory.

The method can further comprise determining, by the address generator 125, a superset of address space values, which indicates the highest number of banks in any of the multiple memories 150(*a*)-(*c*), the highest number of word lines per bank in any of the multiple memories 150(*a*)-(*c*) and the highest decode number per data bit column in any of the multiple memories 150(*a*)-(*c*) (404). As discussed in detail above with regard to the integrated circuit chip embodiments, the superset of address space values can be determined based on information stored in input/output interface blocks and, particularly, based on information stored in first input/output interface blocks 130(*a*)-(*c*) connected between the BIST engine 120 and the memories 150(*a*)-(*c*). Specifically, each first input/output interface block 130(*a*)-(*c*) can store a set of address space values for a corresponding memory 150(*a*)-(*c*). The set of address space values can indicate the number of banks in the corresponding memory, the number of word lines per bank in the corresponding memory and the decode number per data bit column in the corresponding memory. The sets of address space values for each memory 150(a)-(c) (or a specified number of MSBs thereof, as discussed in detail above) can be forwarded by the first input/output interface blocks 130(a)-(c) to the BIST engine 120 and, particularly, to the address generator 125 and used to determine the subset of address space values.

The method can further comprise masking, by the address generator 125 using an address mask register, any possible test addresses that are within the predetermined maximum address space (e.g., 256K addresses) and that have address space values that are above the highest number of banks, the highest number of word lines per bank and/or the highest decode number per data bit column (406). That is, any possible test addresses that are within the predetermined maximum address space and that reference a bank number above the highest number of banks in the superset, that reference a word address above the highest number of word lines in the superset and/or that reference a decode number above the highest decode number per data bit column in the superset will be masked.

The method can further comprise generating, by the address generator 125, test addresses for testing the multiple memories 150(a)-(c) in parallel (408). This process of generating the test addresses can specifically be performed such that all test addresses that are generated are within a composite address space defined by the superset of address space values and, thereby within an address space that may, depending upon the actual configuration of the memories, be less than the predetermined maximum address space associated with such memories.

Finally, the method can comprise testing, by the built-in self-test engine 120, the multiple memories 150(a)-(c) in parallel using the test addresses generated at process 408 (410). That is, the BIST engine 120 can, via the pairs of input/output interface blocks, sweep through the address spaces of each memory 150(a)-(c), writing the test patterns to the memories cells in those memories 150(a)-(c) at the generated test addresses and subsequently causing the memory cells at those test addresses in the memories 150(a)-(c) to be read and the data out to be analyzed in order to detect any faulty memory cells in any of the memories 150(a)-(c). Upon detection of faulty memory cells in any the memories 150(a)-(c), the corresponding FARRs 135(a)-(c) can register the failing addresses and can calculate appropriate repair solutions. Since the composite address space is defined by the highest number of banks in any of the memories 150(a)-(c), the highest number of word lines in any of the memories 150(a)-(c) and the highest decode number per data bit column in any of the memories 150(a)-(c), the method can reduce the time required for testing, if possible (e.g., when all of the memories 150(a)-(c) are relatively small) while still ensuring that all memory locations within all of the memories 150(a)-(c) are properly tested.

Figure 5:
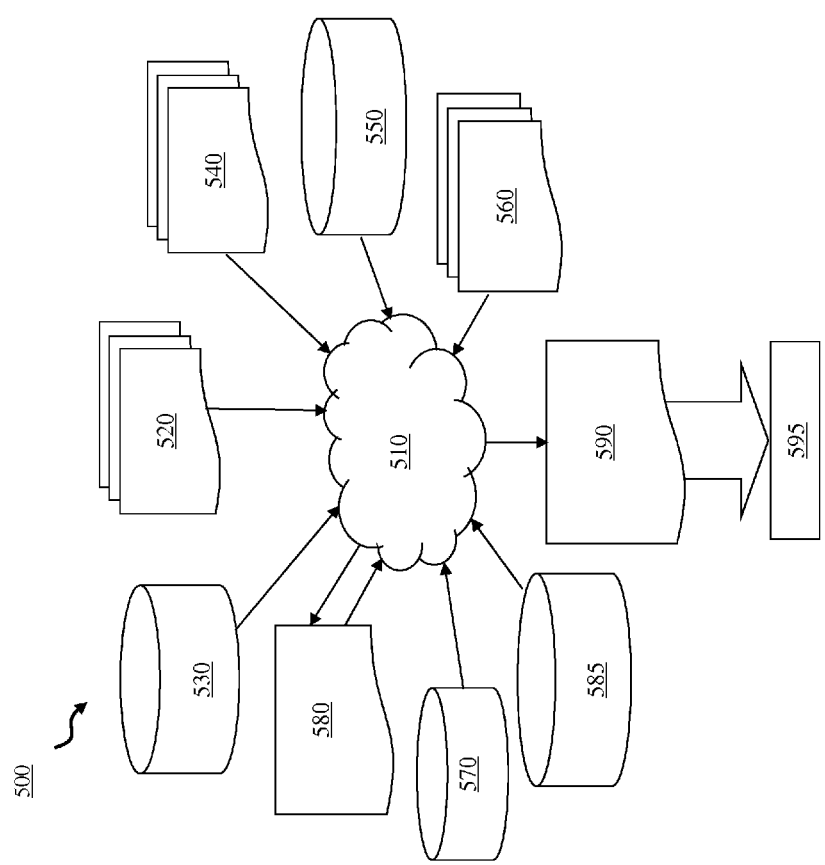
FIG. 5 shows a block diagram of an exemplary design flow.

FIG. 5 shows a block diagram of an exemplary design flow 500 used for example, in semiconductor IC logic design, simulation, test, layout, and manufacture. Design flow 500 includes processes, machines and/or mechanisms for processing design structures or devices to generate logically or otherwise functionally equivalent representations of the embodiments of the integrated circuit chip 100 shown in FIG. 1A and comprising a plurality of memories, as shown in FIG. 1B and a BIST circuit 101 configured as shown in either FIG. 2 or FIG. 3. The design structures processed and/or generated by design flow 500 may be encoded on machine-readable transmission or storage media to include data and/or instructions that when executed or otherwise processed on a data processing system generate a logically, structurally, mechanically, or otherwise functionally equivalent representation of hardware components, circuits, devices, or systems. Machines include, but are not limited to, any machine used in an IC design process, such as designing, manufacturing, or simulating a circuit, component, device, or system. For example, machines may include: lithography machines, machines and/or equipment for generating masks (e.g. e-beam writers), computers or equipment for simulating design structures, any apparatus used in the manufacturing or test process, or any machines for programming functionally equivalent representations of the design structures into any medium (e.g. a machine for programming a programmable gate array).

Design flow 500 may vary depending on the type of representation being designed. For example, a design flow 500 for building an application specific IC (ASIC) may differ from a design flow 500 for designing a standard component or from a design flow 500 for instantiating the design into a programmable array, for example a programmable gate array (PGA) or a field programmable gate array (FPGA) offered by Altera® Inc. or Xilinx® Inc.

FIG. 5 illustrates multiple such design structures including an input design structure 520 that is preferably processed by a design process 510. Design structure 520 may be a logical simulation design structure generated and processed by design process 510 to produce a logically equivalent functional representation of a hardware device. Design structure 520 may also or alternatively comprise data and/or program instructions that when processed by design process 510, generate a functional representation of the physical structure of a hardware device. Whether representing functional and/or structural design features, design structure 520 may be generated using electronic computer-aided design (ECAD) such as implemented by a core developer/designer. When encoded on a machine-readable data transmission, gate array, or storage medium, design structure 520 may be accessed and processed by one or more hardware and/or software modules within design process 510 to simulate or otherwise functionally represent an integrated circuit chip as shown in FIG. 1A comprising a plurality of memories (e.g., as shown in FIG. 1B) with a BIST circuit 101 configured as shown in either FIG. 2 or FIG. 3. As such, design structure 520 may comprise files or other data structures including human and/or machine-readable source code, compiled structures, and computer executable code structures that when processed by a design or simulation data processing system, functionally simulate or otherwise represent circuits or other levels of hardware logic design. Such data structures may include hardware-description language (HDL) design entities or other data structures conforming to and/or compatible with lower-level HDL design languages such as Verilog and VHDL, and/or higher-level design languages such as C or C++.

Design process 510 preferably employs and incorporates hardware and/or software modules for synthesizing, translating, or otherwise processing a design/simulation functional equivalent of the integrated circuit chip shown in FIG. 1A comprising a plurality of memories (e.g., as shown in FIG. 1B) and a BIST circuit 101 configured as shown in either FIG. 2 or FIG. 3 to generate a Netlist 580 which may contain design structures such as design structure 520. Netlist 580 may comprise, for example, compiled or otherwise processed data structures representing a list of wires, discrete components, logic gates, control circuits, I/O devices, models, etc. that describes the connections to other elements and circuits in an integrated circuit design. Netlist 580 may be synthesized using an iterative process in which netlist 580 is resynthesized one or more times depending on design specifications and parameters for the device. As with other design structure types described herein, netlist 580 may be recorded on a machine-readable data storage medium or programmed into a programmable gate array. The medium may be a non-volatile storage medium such as a magnetic or optical disk drive, a programmable gate array, a compact flash, or other flash memory. Additionally, or in the alternative, the medium may be a system or cache memory, buffer space, or electrically or optically conductive devices and materials on which data packets may be transmitted and intermediately stored via the Internet, or other networking suitable means.

Design process 510 may include hardware and software modules for processing a variety of input data structure types including Netlist 580. Such data structure types may reside, for example, within library elements 530 and include a set of commonly used elements, circuits, and devices, including models, layouts, and symbolic representations, for a given manufacturing technology (e.g., different technology nodes, 32 nm, 45 nm, 90 nm, etc.). The data structure types may further include design specifications 540, characterization data 550, verification data 560, design rules 570, and test data files 585 which may include input test patterns, output test results, and other testing information. Design process 510 may further include, for example, standard mechanical design processes such as stress analysis, thermal analysis, mechanical event simulation, process simulation for operations such as casting, molding, and die press forming, etc. One of ordinary skill in the art of mechanical design can appreciate the extent of possible mechanical design tools and applications used in design process 510 without deviating from the scope and spirit of the invention. Design process 510 may also include modules for performing standard circuit design processes such as timing analysis, verification, design rule checking, place and route operations, etc.

Design process 510 employs and incorporates logic and physical design tools such as HDL compilers and simulation model build tools to process design structure 520 together with some or all of the depicted supporting data structures along with any additional mechanical design or data (if applicable), to generate a second design structure 590. Design structure 590 resides on a storage medium or programmable gate array in a data format used for the exchange of data of mechanical devices and structures (e.g. information stored in a IGES, DXF, Parasolid XT, JT, DRG, or any other suitable format for storing or rendering such mechanical design structures). Similar to design structure 520, design structure 590 preferably comprises one or more files, data structures, or other computer-encoded data or instructions that reside on transmission or data storage media and that when processed by an ECAD system generate a logically or otherwise functionally equivalent form of one or more of the embodiments of the integrated circuit chip shown in FIG. 1A and comprising a plurality of memories (e.g., as shown in FIG. 1B) and a BIST circuit 101 configured as shown in FIG. 2 or FIG. 3. In one embodiment, design structure 590 may comprise a compiled, executable HDL simulation model that functionally simulates the integrated circuit chip shown in FIG. 1A and comprising a plurality of memories (e.g., as shown in FIG. 1B) and a BIST circuit 101 configured as shown in either FIG. 2 or FIG. 3.

Design structure 590 may also employ a data format used for the exchange of layout data of integrated circuits and/or symbolic data format (e.g. information stored in a GDSII (GDS2), GL1, OASIS, map files, or any other suitable format for storing such design data structures). Design structure 590 may comprise information such as, for example, symbolic data, map files, test data files, design content files, manufacturing data, layout parameters, wires, levels of metal, vias, shapes, data for routing through the manufacturing line, and any other data required by a manufacturer or other designer/developer to produce the integrated circuit chip shown in FIG. 1A and comprising a plurality of memories (e.g., as shown in FIG. 1B) and a BIST circuit 101 configured as shown in FIG. 2 or FIG. 3. Design structure 590 may then proceed to a stage 595 where, for example, design structure 590: proceeds to tape-out, is released to manufacturing, is released to a mask house, is sent to another design house, is sent back to the customer, etc.

Figure 6:
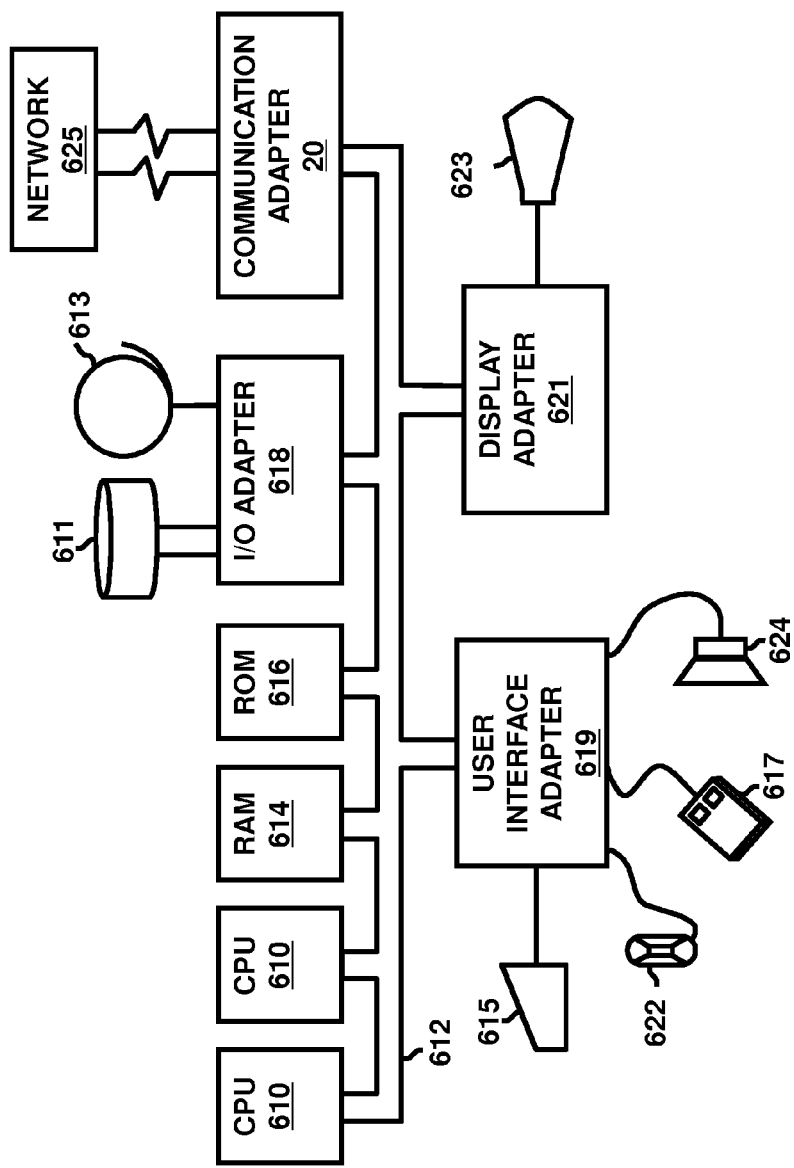
FIG. 6 is a schematic diagram illustrating a representative hardware environment (i.e., a computer system) for implementing the design flow of FIG. 5.

A representative hardware environment (i.e., a computer system) for implementing the above described design flow is depicted in FIG. 6. This schematic drawing illustrates a hardware configuration of an information handling/computer system in accordance with the embodiments herein. The system comprises at least one processor or central processing unit (CPU) 610. The CPUs 610 are interconnected via a system bus 612 to various devices such as a random access memory (RAM) 614, read-only memory (ROM) 616, and an input/output (I/O) adapter 618. The I/O adapter 18 can connect to peripheral devices, such as disk units 611 and tape drives 613, or other program storage devices that are readable by the system. The system can read the inventive instructions on the program storage devices and follow these instructions to execute the methodology of the embodiments herein. The system further includes a user interface adapter 619 that connects a keyboard 615, mouse 617, speaker 624, microphone 622, and/or other user interface devices such as a touch screen device (not shown) to the bus 612 to gather user input. Additionally, a communication adapter 620 connects the bus 612 to a data processing network 625, and a display adapter 621 connects the bus 612 to a display device 623 which may be embodied as an output device such as a monitor, printer, or transmitter, for example.

It should be understood that the terminology used herein is for the purpose of describing the disclosed structures and methods and is not intended to be limiting. For example, as used herein, the singular forms "a", "an" and "the" are intended to include the plural forms as well, unless the context clearly indicates otherwise. Additionally, as used herein, the terms "comprises" "comprising", "includes" and/or "including" specify the presence of stated features, integers, steps, operations, elements, and/or components, but do not preclude the presence or addition of one or more other features, integers, steps, operations, elements, components, and/or groups thereof. Furthermore, as used herein, terms such as "right", "left", "vertical", "horizontal", "top", "bottom", "upper", "lower", "under", "below", "underlying", "over", "overlying", "parallel", "perpendicular", etc., are intended to describe relative locations as they are oriented and illustrated in the drawings (unless otherwise indicated) and terms such as "touching", "on", "in direct contact", "abutting", "directly adjacent to", etc., are intended to indicate that at least one element physically contacts another element (without other elements separating the described elements). The corresponding structures, materials, acts, and equivalents of all means or step plus function elements in the claims below are intended to include any structure, material, or act for performing the function in combination with other claimed elements as specifically claimed.

The descriptions of the various embodiments of the present invention have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein.

Therefore, disclosed above are embodiments of an integrated circuit chip with a built-in self-test (BIST) circuit for testing embedded memories. This BIST circuit incorporates at least one BIST engine, which can test multiple memories in parallel and which can, prior to such testing, dynamically set the size of the address space to be swept during testing. Specifically, the BIST engine can comprise an address generator, which can determine a superset of address space values associated with all the memories to be tested. This superset indicates the highest number of banks in any of the memories, the highest number of word lines per bank in any of the memories and the highest decode number per data bit column in any of the memories. The address generator can then generate test addresses and can do so such that all of these test addresses are within a composite address space defined by the superset of address space values and, thereby within an address space that may, depending upon the actual configuration of the memories, be less than the predetermined maximum address space associated with such memories so as to reduce test time. Also disclosed above are embodiments of a BIST method for testing embedded memories.

What is claimed is:

1. An integrated circuit chip comprising:
   a plurality of memories; and
   a built-in self-test circuit comprising a built-in self-test engine electrically connected to multiple memories of said plurality of memories, said built-in self-test engine comprising an address generator,
   said address generator determining a superset of address space values indicating a highest number of banks in any of said multiple memories, a highest number of word lines per bank in any of said multiple memories and a highest decode number for any of said multiple memories, and
   said address generator further generating test addresses for testing said multiple memories, said test addresses being generated such that all of said test addresses are within a composite address space defined by said superset.

2. The integrated circuit chip of claim 1, said multiple memories comprising at least two memories with different total address spaces.

3. The integrated circuit chip of claim 1, said built-in self-test circuit further comprising pairs of serially connected input/output interface blocks electrically connecting said multiple memories in parallel to said built-in self-test engine,
   each pair of serially connected input/output interface blocks comprising a first input/output interface block connected to said built-in self-test engine and a second input/output interface block connected between said first input/output interface block and a corresponding memory,
   each first input/output interface block in each pair being programmed with a set of address space values for said corresponding memory, said set indicating a number of banks in said corresponding memory, a number of word lines per bank in said corresponding memory and a decode number for said corresponding memory,
   said address generator receiving sets of address space values for all of said multiple memories from all first input/output interface blocks and determining said superset based on said sets.

4. The integrated circuit chip of claim 3, said each first input/output interface block and said built-in self-test engine being controlled by a first clock signal and each second input/output interface block and said corresponding memory being controlled by a second clock signal that is faster than said first clock signal.

5. The integrated circuit chip of claim 3,
   said each first input/output interface block comprising group of multiplexers and a first state machine controlling said group of multiplexers and all first state machines in said all first input/output interface blocks being synchronously operated such that each first state machine outputs a first state signal, a second state signal, and a third state signal in sequence,
   said first state signal causing said group of multiplexers in said each first input/output interface block to output a group of first address space value signals to said built-in self-test engine, said group of first address space value signals indicating said number of banks in said corresponding memory,
   said second state signal causing said group of multiplexers in said each first input/output interface block to output a group of second address space value signals to said built-in self-test engine, said group of second address space value signals indicating said number of word lines per bank in said corresponding memory, and
   said third state signal causing said group of multiplexers in said each first input/output interface block to output a group of third address space value signals to said built-in self-test engine, said group of third address space value signals indicating said decode number for said corresponding memory.

6. The integrated circuit chip of claim 5, said first state signal, said second state signal and said third state signal being output by each of said first state machines during consecutive clock cycles following receipt of a reset signal.

7. The integrated circuit chip of claim 5,
   said address generator comprising comparison logic,
   said comparison logic essentially simultaneously receiving each group of first address space value signals from said each first input/output interface block, comparing all groups of first address space value signals and outputting a selected group of first address space value signals indicating said highest number of banks in any of said multiple memories,
   said comparison logic further essentially simultaneously receiving each group of second address space value signals from said each first input/output interface block, comparing all groups of second address space value signals and outputting a selected group of second address space value signals indicating said highest number of word lines per bank in any of said multiple memories, and said comparison logic essentially simultaneously receiving each group of third address space value signals from said each first input/output interface, comparing all groups of third address space value signals and outputting a selected group of third address space value signals indicating said highest decode number for any of said multiple memories.

8. The integrated circuit chip of claim 7, said address generator further comprising:
an address mask register;
a parallel load register that is electrically connected between said comparison logic and said address mask register; and
a second state machine controlling said parallel load register,
said parallel load register receiving said selected group of first address space value signals from said comparison logic and loading said highest number of banks into said address mask register in response to said first state signal, receiving said selected group of second address space values signals from said comparison logic and loading said highest number of word lines into said address mask register in response to said second state signal, and receiving said selected group of third address space value signals from said comparison logic and loading said highest decode number into said address mask register in response to said third state signal.

9. The integrated circuit chip of claim 8, said address mask register ensuring that any test addresses within a predetermined maximum address space and having address space values above any of said highest number of banks, said highest number of word lines per bank and said highest decode number are masked during generation of said test addresses.

10. An integrated circuit chip comprising:
a plurality of memories; and
a built-in self-test circuit comprising a built-in self-test engine electrically connected to multiple memories of said plurality of memories and comprising an address generator,
said built-in self-test circuit further comprising pairs of serially connected input/output interface blocks electrically connecting said multiple memories in-parallel to said built-in self-test engine,
each pair of serially connected input/output interface blocks comprising a first input/output interface block connected to said built-in self-test engine and a second input/output interface block connected between said first input/output interface block and a corresponding memory,
each first input/output interface block in each pair being programmed with a set of address space values for said corresponding memory, said set indicating a number of banks in said corresponding memory, a number of word lines per bank in said corresponding memory and a decode number for said corresponding memory,
said each first input/output interface block comprising a group of multiplexers and a first state machine controlling said group of multiplexers and all first state machines in all first input/output interface blocks being synchronously operated such that each first state machine outputs a first state signal, a second state signal, a third state signal, and an additional state signal in sequence;
said first state signal causing said group of multiplexers in said each first input/output interface block to output a group of first address space value signals to said built-in self-test engine, said group of first address space value signals indicating said number of banks in said corresponding memory,
said second state signal causing said group of multiplexers in said each first input/output interface block to output a group of second address space value signals to said built-in self-test engine, said group of second address space value signals indicating said number of word lines per bank in said corresponding memory, and
said third state signal causing said group of multiplexers in said each first input/output interface block to output a group of third address space value signals to said built-in self-test engine, said group of third address space value signals indicating said decode number for said corresponding memory, and
said address generator determining a superset of address space values by determining, in sequence, a highest number of banks in any of said multiple memories based on all groups of first address space values received from said all first input/output interface blocks, a highest number of word lines per bank in any of said multiple memories based on all groups of second address space values received from said all first input/output interface blocks and a highest decode number for any of said multiple memories based on all groups of third address space values received from said all first input/output interface,
said address generator further generating test addresses for testing said multiple memories, said test addresses being generated such that all of said test addresses are within a composite address space defined by said superset, and
said additional state signal causing said group of multiplexers to output a group of different built-in self-test operational signals to said built-in self-test engine during said testing of said multiple memories.

11. The integrated circuit chip of claim 10, said multiple memories comprising at least two memories with different total address spaces.

12. The integrated circuit chip of claim 11, said each first input/output interface block and said built-in self-test engine being controlled by a first clock signal and each second input/output interface block and said corresponding memory being controlled by a second clock signal that is faster than said first clock signal.

13. The integrated circuit chip of claim 10, said first state signal, said second state signal, said third state signal and said additional state signal being output by each of said first state machines during consecutive clock cycles following receipt of a reset signal.

14. The integrated circuit chip of claim 10,
said address generator comprising comparison logic,
said comparison logic essentially simultaneously receiving each group of first address space value signals from said each first input/output interface block, comparing said all groups of first address space value signals and outputting a selected group of first address space value signals indicating said highest number of banks in any of said multiple memories,
said comparison logic further essentially simultaneously receiving each group of second address space value signals from said each first input/output interface block, comparing said all groups of second address space value signals and outputting a selected group of second address space value signals indicating said highest number of word lines per bank in any of said multiple memories, and said comparison logic essentially simultaneously receiving each group of third address space value signals from said each first input/output interface block, comparing said all groups of third address space value signals and outputting a selected group of third address space value signals indicating said highest decode number for any of said multiple memories.

15. The integrated circuit chip of claim 14, said address generator further comprising:
an address mask register;
a parallel load register that is electrically connected between said comparison logic and said address mask register; and
a second state machine controlling said parallel load register,
said parallel load register receiving said selected group of first address space value signals from said comparison logic and loading said highest number of banks into said address mask register in response to said first state signal, receiving said selected group of second address space values signals from said comparison logic and loading said highest number of word lines per bank into said address mask register in response to said second state signal, and receiving said selected group of third address space value signals from said comparison logic and loading said highest decode number into said address mask register in response to said third state signal.

16. The integrated circuit chip of claim 15, said address mask register ensuring that any test addresses within a predetermined maximum address space and having address space values above any of said highest number of banks, said highest number of word lines per bank and said highest decode number are masked during generation of said test addresses.

17. A built-in self-test method comprising:
providing an integrated circuit chip comprising a plurality of memories and a built-in self-test circuit, said built-in self-test circuit comprising a built-in self-test engine electrically connected to multiple memories of said plurality of memories and comprising an address generator;
determining, by said address generator, a superset of address space values indicating a highest number of banks in any of said multiple memories, a highest number of word lines per bank in any of said multiple memories and a highest decode number for any of said multiple memories; and
generating, by said address generator, test addresses for testing said multiple memories, said test addresses being generated such that all of said test addresses generated are within a composite address space defined by said superset.

18. The method of claim 17, said multiple memories being a specific type of memory, said specific type of memory having a predetermined maximum address space and at least one of said multiple memories having a total address space that is less than said predetermined maximum address space.

19. The method of claim 18, further comprising, prior to said generating, masking, by said address generator, possible test addresses that are within said predetermined maximum address space and that have at least one of a bank address above said highest number of banks, a word address above said highest number of word lines per bank and a decode number above said highest decode number.

20. The method of claim 17, further comprising testing, by said built-in self-test engine, said multiple memories in parallel using said test addresses.

* * * * *